(12) United States Patent
Otsuka et al.

(10) Patent No.: US 8,105,886 B2
(45) Date of Patent: Jan. 31, 2012

(54) SEMICONDUCTOR ELECTRICALLY PROGRAMMABLE FUSE ELEMENT WITH AMORPHOUS SILICON LAYER AFTER PROGRAMMING AND METHOD OF PROGRAMMING THE SAME

(75) Inventors: Nobuaki Otsuka, Komae (JP); Takahiko Sasaki, Tokyo (JP); Shuso Fujii, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 887 days.

(21) Appl. No.: 12/099,422

(22) Filed: Apr. 8, 2008

(65) Prior Publication Data
US 2008/0258256 A1    Oct. 23, 2008

Related U.S. Application Data

(62) Division of application No. 10/851,143, filed on May 24, 2004, now Pat. No. 7,368,801.

(30) Foreign Application Priority Data

Feb. 27, 2004 (JP) ................................. 2004-054910

(51) Int. Cl.
*H01L 21/00* (2006.01)
(52) U.S. Cl. ................... 438/132; 438/467; 438/382
(58) Field of Classification Search .................. 438/132, 438/467, 382
See application file for complete search history.

(56) References Cited

U.S. PATENT DOCUMENTS

| 4,835,118 | A | | 5/1989 | Jones et al. |
|---|---|---|---|---|
| 5,708,291 | A | * | 1/1998 | Bohr et al. ..................... 257/529 |
| 5,969,404 | A | * | 10/1999 | Bohr et al. ..................... 257/529 |
| 5,976,943 | A | * | 11/1999 | Manley et al. ................ 438/382 |
| 6,258,700 | B1 | * | 7/2001 | Bohr et al. ..................... 438/467 |
| 6,323,535 | B1 | | 11/2001 | Iyer et al. |
| 6,337,507 | B1 | * | 1/2002 | Bohr et al. ..................... 257/529 |
| 6,624,499 | B2 | | 9/2003 | Kothandaraman et al. |
| 6,798,684 | B2 | | 9/2004 | Low et al. |
| 6,992,945 | B2 | | 1/2006 | Otsuka |
| 7,368,801 | B2 | * | 5/2008 | Otsuka et al. ................. 257/529 |
| 7,662,674 | B2 | * | 2/2010 | Maiz et al. .................... 438/132 |
| 7,732,898 | B2 | * | 6/2010 | Barth ............................. 257/665 |
| 7,759,226 | B1 | * | 7/2010 | Lee et al. ...................... 438/467 |
| 7,817,455 | B2 | * | 10/2010 | Fredeman et al. .............. 365/96 |
| 2005/0189613 | A1 | * | 9/2005 | Otsuka et al. ................. 257/529 |

(Continued)

FOREIGN PATENT DOCUMENTS
JP    5-121687    5/1993
(Continued)

OTHER PUBLICATIONS

Stefan Holzer, et al., "Extraction of Material Parameters Based on Inverse Modeling of Three-Dimensional Interconnect Structures", 9th Therminic Workshop, Sep. 24-26, 2003, pp. 263-268.

(Continued)

*Primary Examiner* — Laura M Menz
(74) *Attorney, Agent, or Firm* — Oblon, Spivak, McClelland, Maier & Neustadt, L.L.P.

(57) ABSTRACT

A fuse link is formed between first and second terminals. The first and second terminals and fuse link have a polysilicon layer and a layer formed on the polysilicon layer and containing a metal element. At least a portion of the fuse link is an amorphous silicon layer.

7 Claims, 9 Drawing Sheets

U.S. PATENT DOCUMENTS

| | | | |
|---|---|---|---|
| 2006/0261437 A1* | 11/2006 | Maiz et al. | 257/529 |
| 2007/0069331 A1* | 3/2007 | Maiz et al. | 257/529 |
| 2007/0210414 A1* | 9/2007 | Iwamoto et al. | 257/529 |
| 2008/0186788 A1* | 8/2008 | Barth | 365/225.7 |
| 2008/0258256 A1* | 10/2008 | Otsuka et al. | 257/529 |
| 2009/0243032 A1* | 10/2009 | Chen | 257/529 |
| 2010/0264514 A1* | 10/2010 | Iwamoto et al. | 257/529 |

FOREIGN PATENT DOCUMENTS

| | | |
|---|---|---|
| JP | 7-221188 | 8/1995 |
| JP | 7-312390 | 11/1995 |
| JP | 8-236632 | 9/1996 |
| JP | 9-230828 | 9/1997 |
| JP | 11-512879 | 11/1999 |
| JP | 2001-176977 | 6/2001 |
| WO | WO 97/12401 | 4/1997 |

OTHER PUBLICATIONS

C. Kothandaraman, et al., "Electrically Programmable Fuse (eFUSE) Using Electromigration in Silicides", IEEE Electron Device Letters, vol. 23, No. 9, Sep. 2002, pp. 523-525.

Mohsen Alavi, et al., "A PROM Element Based on Salicide Agglomeration of Poly Fuses in a CMOS Logic Process", IEDM Digest 1997, pp. 855-858.

* cited by examiner

| Sample No. | W(μm) | L(μm) | R(Ω) | Current value (mA) before programming | Current value (μA) after programming |
|---|---|---|---|---|---|
| 1 | 0.1 | 1.0 | 100 | 3.0966 | 0.1 |
| 2 | 0.07 | 1.0 | 143 | 2.6640 | 0.1 |
| 3 | 0.2 | 1.0 | 50 | 4.0894 | 0.1 |
| 4 | 0.1 | 2.0 | 200 | 2.1402 | 0.1 |
| 5 | 0.1 | 4.0 | 400 | 1.4613 | 0.1 |
FIG. 4
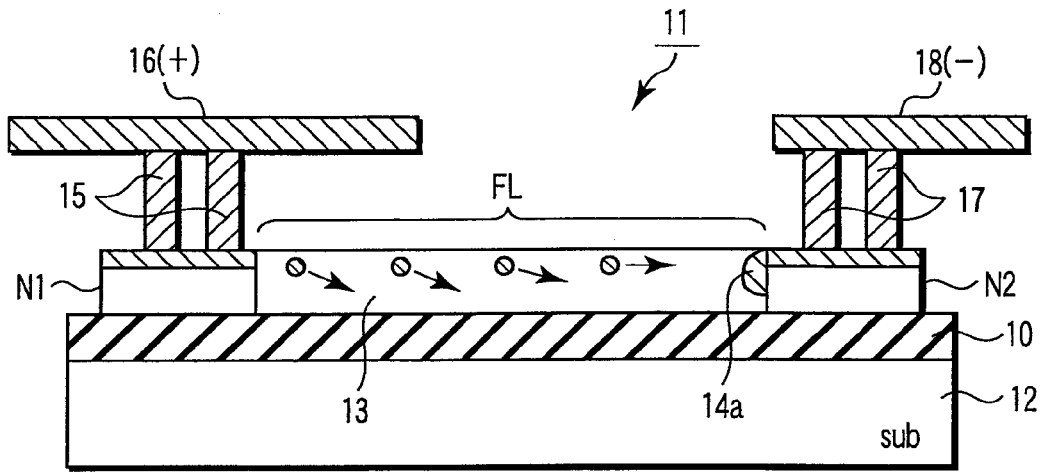
FIG. 5
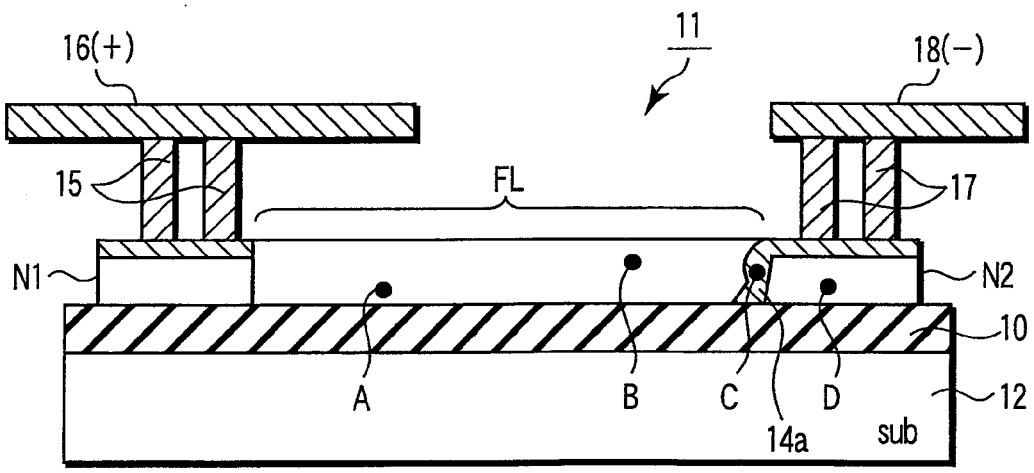
FIG. 6

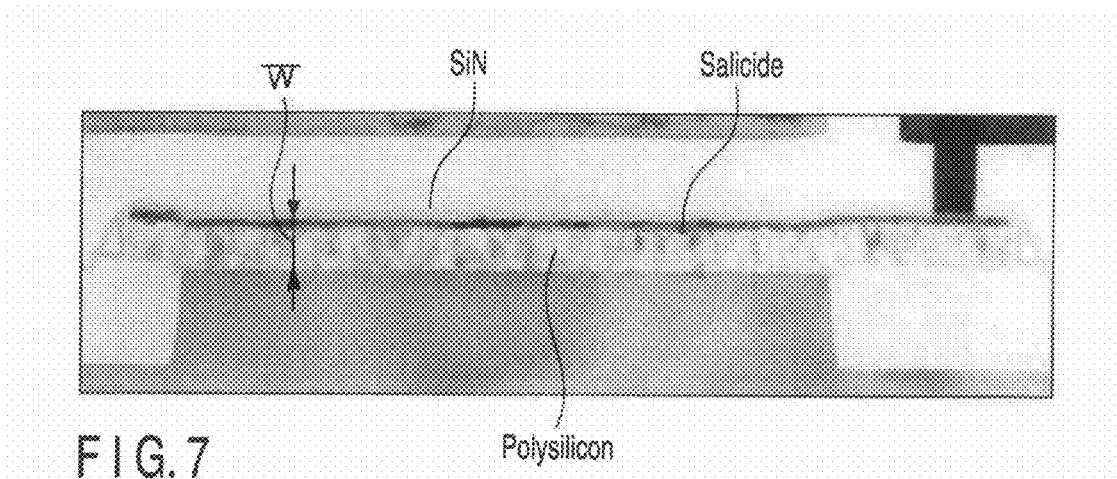
F I G. 7
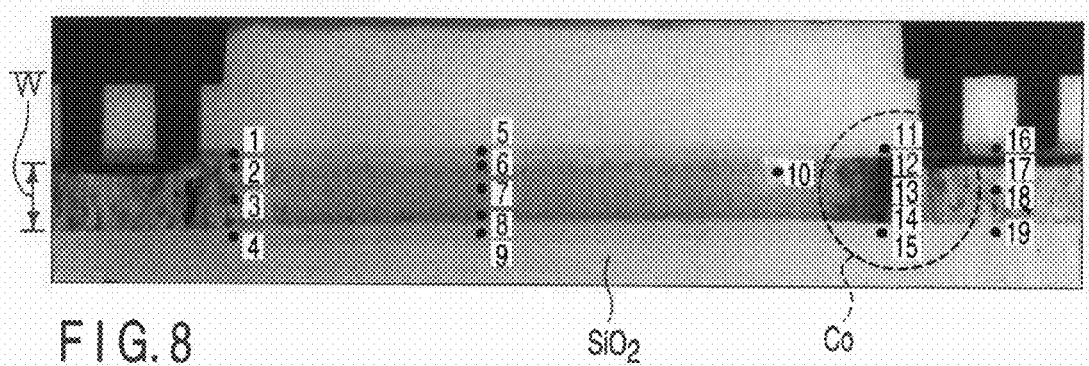
F I G. 8
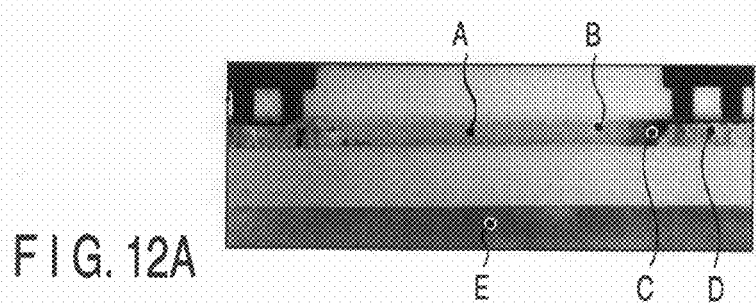
F I G. 12A
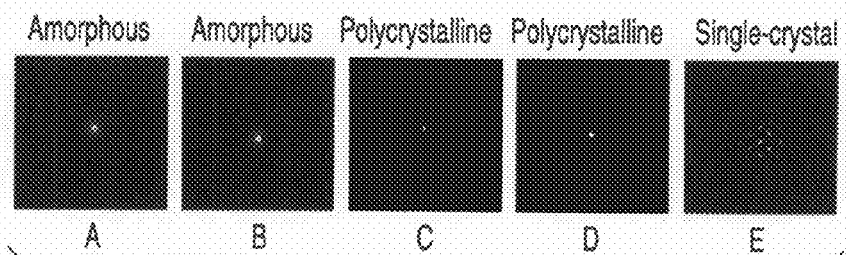
F I G. 12B

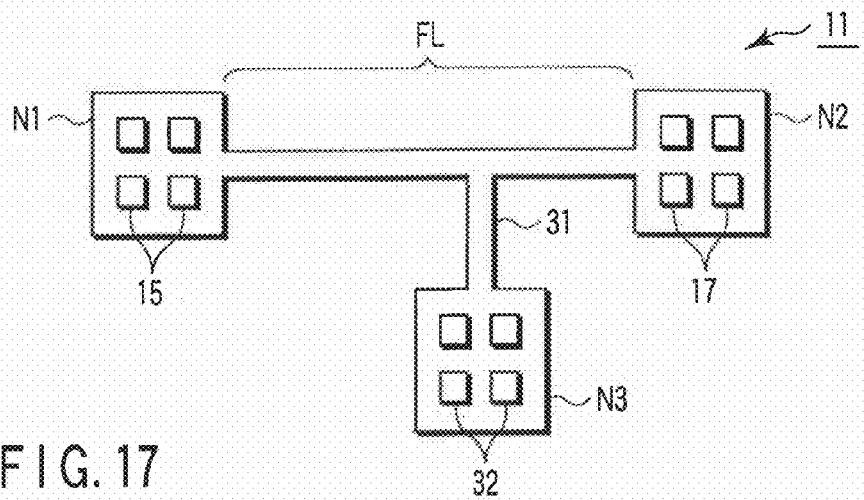
F I G. 17
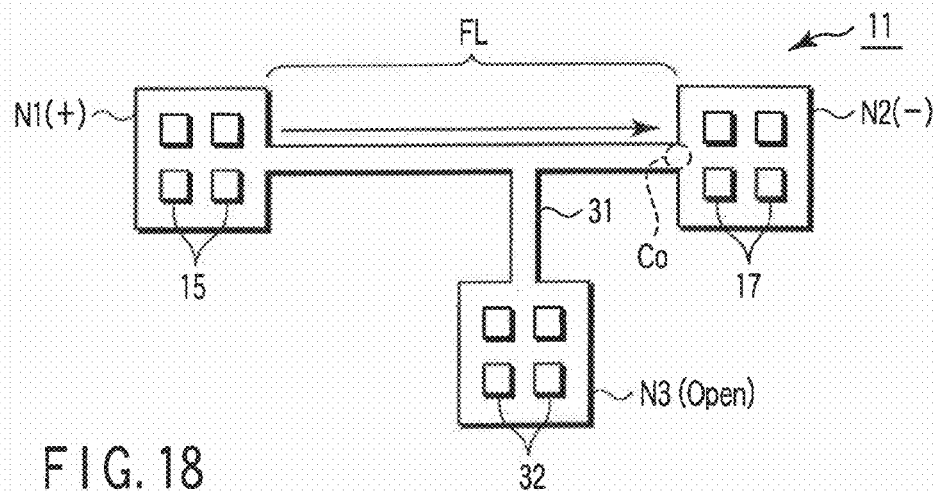
F I G. 18
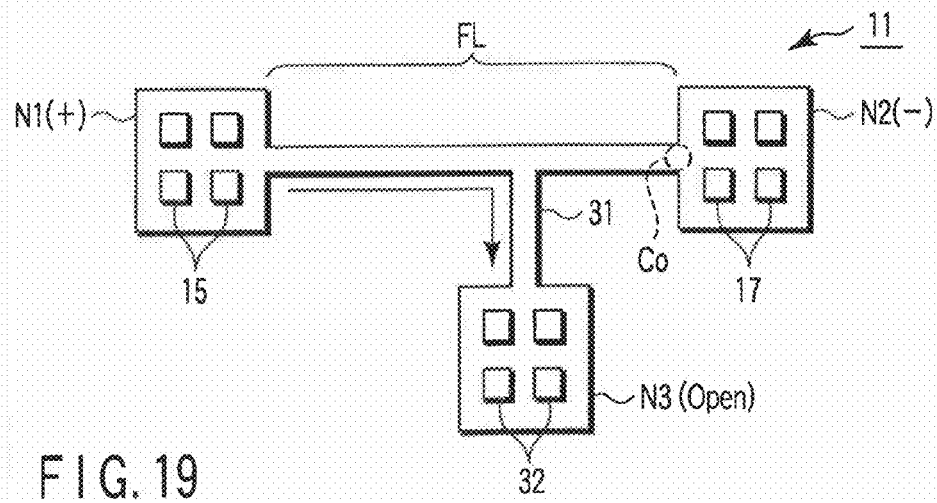
F I G. 19

SEMICONDUCTOR ELECTRICALLY PROGRAMMABLE FUSE ELEMENT WITH AMORPHOUS SILICON LAYER AFTER PROGRAMMING AND METHOD OF PROGRAMMING THE SAME

CROSS-REFERENCE TO RELATED APPLICATIONS

This application is a divisional of U.S. application Ser. No. 10/851,143, filed May 24, 2004, and is based upon and claims the benefit of priority from prior Japanese Patent Application No. 2004-054910, filed Feb. 27, 2004, the entire contents of both of which are incorporated herein by reference.

BACKGROUND OF THE INVENTION

1. Field of the Invention

The present invention relates to a semiconductor device as an electrically programmable fuse element to be applied to, e.g., a redundancy circuit of a semiconductor memory, and a method of programming the same.

2. Description of the Related Art

A laser fuse element is conventionally used as a fuse element in a redundancy circuit of a semiconductor memory. Unfortunately, a fuse blow step using a laser system prolongs the TAT (Turn Around Time), and this increases the test cost and deteriorates the ease of the test. To solve these problems, an electrically programmable fuse element (to be referred to as an e-fuse hereinafter) is developed. The e-fuses are classified into various types such as a type by which a gate oxide film is destroyed, and a type by which a line itself is fused by a current stress. In the following description, an e-fuse using a gate wiring structure will be explained.

This e-fuse has two terminals and a fuse link connected between them. The two terminals and fuse link are formed by a CMOS process by using the same material as a gate line. That is, the two terminals and fuse link are made up of, e.g., a polysilicon layer and a silicide layer formed on the polysilicon layer in self-alignment with it. The two terminals are connected to an upper metal layer via contacts and are electrically controllable. The e-fuse is programmed by applying a current stress to the fuse link via the contacts. This programming increases the resistance of the e-fuse.

Examples of this e-fuse programming method are methods using physical phenomena called self-agglomeration (self-assemble) and electromigration.

In the method using self-agglomeration, Joule heat is generated by supplying an electric current to a fuse element. When this heat makes the temperature of the fuse element higher than the temperature of salicide formation, a salicide layer on a polysilicon layer causes self-agglomeration. The self-agglomeration is a phenomenon in which a metal element agglomerates in, e.g., the triple point of the boundary of the polysilicon crystal. When this self-agglomeration occurs, a plurality of regions in which no salicide layer is present on the polysilicon layer are formed. As a consequence, the resistance of the fuse element increases (e.g., reference 1 "A PROM Element Based on Salicide Agglomeration of Poly Fuses in a CMOS Logic Process" IEDM 97, 855-858).

On the other hand, in the method using electromigration, a voltage of, e.g., 3.3 V is applied to a fuse element. Joule heat generated by this voltage raises the temperature of the fuse element to a temperature at which electromigration occurs. At this temperature, a metal element forming a salicide layer on a polysilicon layer is localized to the anode terminal by the electromigration. Also, an impurity (dopant) in the polysilicon layer is localized to the anode by the electromigration. This forms a region not doped with the impurity but made of polysilicon alone in the fuse element. Consequently, the resistance of the fuse element increases (e.g., reference 2 "Electrically Programmable Fuse (eFUSE) Using Electromigration in Silicides" IEEE Electron Device Letters, Vol. 23, No. 9, September 2002).

According to reference 2, in the fuse element using electromigration described above, an electric current of, e.g., 7 mA must be supplied for 200 µs in order to localize the metal element and the impurity element in the polysilicon layer to one of the two terminals by electromigration. Generally, it is difficult to simultaneously cut a large number of e-fuses, because programming requires an electric current of the mA order. Normally, therefore, fuse elements are individually programmed. Accordingly, if programming one fuse element requires 200 µs, programming n fuse elements requires n×200 µs. In addition, an electric current of 7 mA must be kept supplied during the programming. This prolongs the fuse element programming time, and also increases the current consumption.

BRIEF SUMMARY OF THE INVENTION

According to a first aspect of the invention, there is provided a semiconductor device comprising a first terminal, a second terminal, and a fuse link formed between the first and second terminals, wherein the first and second terminals have a polysilicon layer and a layer formed on the polysilicon layer and containing a metal element, and at least a portion of the fuse link is an amorphous silicon layer.

According to a second aspect of the invention, there is provided a semiconductor device comprising a first terminal, a second terminal, and a fuse link formed between the first and second terminals, wherein the first and second terminals and fuse link have a polysilicon layer and a layer formed on the polysilicon layer and containing a metal element, and at least a portion of the fuse link changes into an amorphous silicon layer.

According to a third aspect of the invention, there is provided a method of programming a semiconductor device, in which the semiconductor device comprises first and second terminals, and a fuse link formed between the first and second terminals, the first and second terminals and fuse link having a polysilicon layer and a layer formed on the polysilicon layer and containing a metal element, and the method comprises supplying an electric current to the fuse link, thereby fusing the polysilicon layer in at least a portion of the fuse link, and localizing the metal element to a portion of the fused polysilicon layer, which is near the first terminal.

BRIEF DESCRIPTION OF THE SEVERAL VIEWS OF THE DRAWING

FIG. 4 is a view showing examples of e-fuses applied to embodiments of the present invention;

FIG. 5 is a sectional view showing a programming operation of the e-fuse shown in FIGS. 1 and 2;

FIG. 6 is a sectional view showing the state of the e-fuse shown in FIGS. 1 and 2 after programming;

FIG. 7 is a transmission electron micrograph showing a MOS transistor before programming;

FIG. 8 is a transmission electron micrograph showing the MOS transistor after programming;

FIG. 12A shows a transmission electron micrograph of a programmed e-fuse, and

FIG. 12B shows photographs of TEM electron beam diffraction images of the crystal states of corresponding portions in FIG. 12A;

FIG. 17 is a plan view showing a modification of the second embodiment;

FIG. 18 is a view showing the relationship between the voltage and electric current in each portion when programming is performed in FIG. 17;

FIG. 19 is a view showing the relationship between the voltage and electric current in each portion when data read is performed in FIG. 17;

DETAILED DESCRIPTION OF THE INVENTION

Embodiments of the present invention will be described below with reference to the accompanying drawings.

Figure 1:
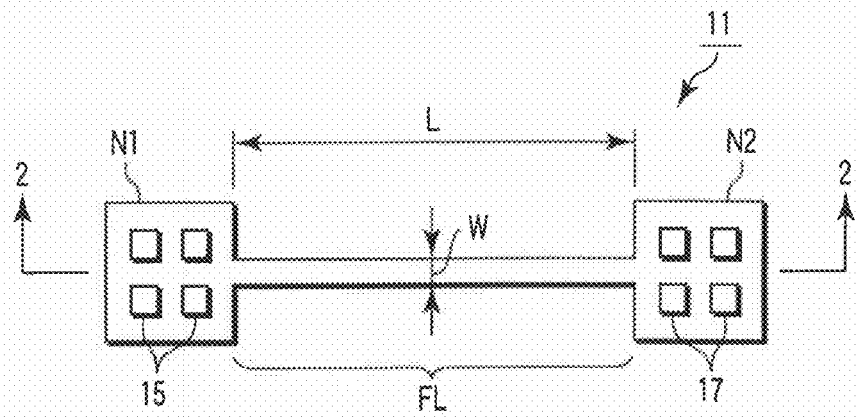
FIG. 1 is a plan view showing the first embodiment of the present invention.
Figure 2:
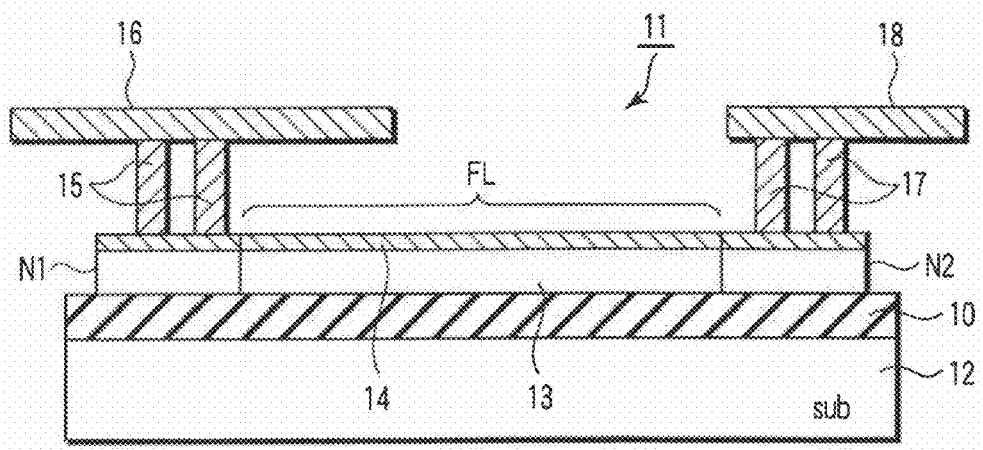
FIG. 2 is a sectional view taken along a line 2-2 in FIG. 1.

FIGS. 1 and 2 illustrate the first embodiment. An e-fuse 11 is made up a first terminal N1, a second terminal N2, and a fuse link FL connected between the first and second terminals N1 and N2. The first and second terminals N1 and N2 and fuse link FL are made of the same material as the gate electrode of a MOS transistor. That is, as shown in FIG. 2, a silicon oxide film 10 is formed on a semiconductor substrate (sub) 12. On the silicon oxide film 10, the first and second terminals N1 and N2 and fuse link FL are formed by a polysilicon layer 13, and a silicide layer 14 (to be referred to as a salicide layer hereinafter) is formed on the polysilicon layer 13 in self-alignment with it. A metal element forming the salicide layer 14 is, e.g., cobalt. However, it is also possible to use, e.g., titanium, nickel, or tungsten, instead of cobalt. The first terminal N1 is connected to a line 16 via a plurality of contacts 15 formed in the salicide layer 14. The second terminal N2 is connected to a line 18 via a plurality of contacts 17 formed in the salicide layer 14. The contacts 15 and 17 are made of a metal having a melting point higher than those of the metal elements forming the salicide layer 14 and polysilicon layer 13. In this embodiment, the salicide layer 14 is made of cobalt, so the contacts 15 and 17 are made of tungsten or the like, and the lines 16 and 18 are made of aluminum or copper.

Figure 3:
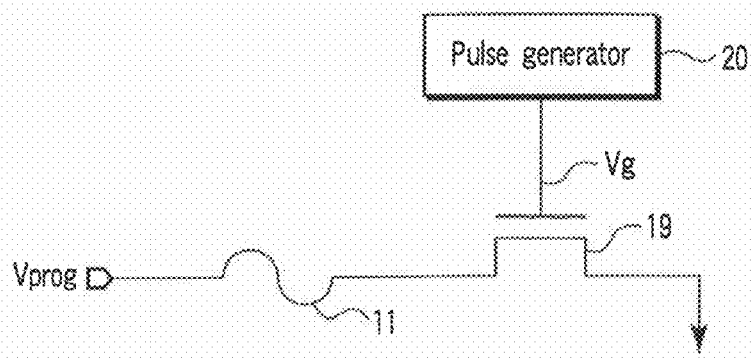
FIG. 3 is a circuit diagram showing an example of a circuit for programming an e-fuse shown in FIG. 2.

FIG. 3 shows an example of a circuit configuration for programming the e-fuse 11 having the above arrangement. A programming voltage Vprog is supplied to one end of the e-fuse 11. The other end of the e-fuse 11 is connected to one end of an n-channel MOS transistor 19. The other end of the MOS transistor 19 is grounded. The gate electrode of the MOS transistor 19 is connected to a pulse generator 20 which supplies a voltage Vg to this gate electrode.

In the fuse link FL, the thickness of the polysilicon layer 13 is, e.g., 0.175 μm, and the thickness of the salicide layer 14 is, e.g., 0.02 μm. Also, the polysilicon layer 13 is not doped with either an n- or p-type impurity. Therefore, the specific resistance is high.

FIG. 4 shows the relationship between a width W and length L of the fuse link FL and a resistance R and the like.

The MOS transistor 19 is turned on by a pulse signal output from the pulse generator 20, and an electric current is supplied to the e-fuse 11. The voltage Vg supplied to the gate of the MOS transistor 19 and a period T of the pulse signal are, for example, Vg=2.5 V and T=5 μs. Also, the programming voltage Vprog of the e-fuse 11 is Vprog=3.5 V.

When the MOS transistor 19 is turned on, an electric current is supplied to the e-fuse 11. Since the non-doped polysilicon layer 13 has a large resistance value, the electric current primarily flows through the salicide layer 14 in the initial stages of power supply. In this state, Joule heat is generated by the fuse link FL. When this heat reaches about 1,400° C., the polysilicon layer 13 fuses.

As shown in FIG. 5, when the polysilicon layer 13 fuses, cobalt in the salicide layer 14 is ionized into positive ions. These positive ions drift and are drawn to the cathode by the electric field, so cobalt is localized to the cathode (reference numeral 14a denotes the localized cobalt). When the electric current to the e-fuse 11 is shut off, the supply of the Joule heat is also shut off, so the e-fuse 11 cools down to set again. When the e-fuse 11 cools down before cobalt starts diffusing from the vicinity of the cathode, as shown in FIG. 6, a fuse link FL including a high-resistance region not containing cobalt is formed. As a consequence, the resistance of the e-fuse 11 itself rises.

Also, after the electric current to the e-fuse 11 is shut off, the e-fuse 11 rapidly cools down. This changes the properties of the crystal in the e-fuse 11. In the fuse link FL as shown in FIG. 6, the material is amorphous between the localized cobalt 14a and the anode (+) (indicated by points A and B), and the material is polycrystalline between the localized cobalt and the cathode (−) (indicated by points C and D). This change in properties will be explained in detail later.

FIGS. 7 and 8 are photographs taken by a TEM (Transmission Electron Microscope) and showing changes in properties of the e-fuse 11 before and after programming.

FIG. 7 shows the gate electrode of the MOS transistor 9. Referring to FIG. 7, a black layer on a polysilicon layer forming the gate electrode is a salicide layer. STI (Silicon Trench Isolation) is formed as an element isolation region in the substrate on the two sides of the polysilicon layer. The gate electrode is covered with a silicon nitride film (SiN) as an insulting film. Similar to the gate electrode shown in FIG. 7, a salicide layer is formed on a polysilicon layer of the e-fuse 11 before programming.

FIG. 8 shows the e-fuse 11 after programming. After programming, the salicide layer present on the polysilicon layer disappears, and the salicide layer is localized to the vicinity of the cathode. Black portions in the photograph are regions where cobalt exists. Fusion caused by heat during programming also changes the properties of the silicon nitride layer present on the salicide layer before programming and the properties of the boundary surface between the polysilicon layer and a silicon oxide film ($SiO_2$) before programming.

Figure 9A:
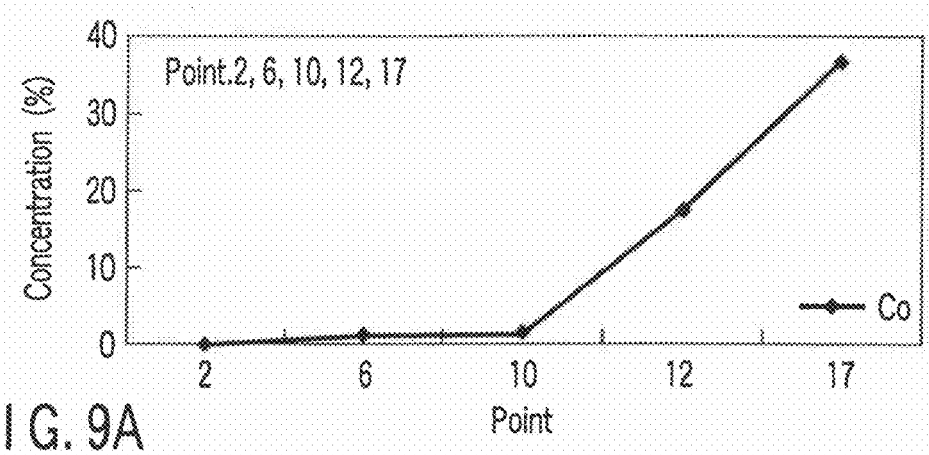
FIGS. 9A and 9B are graphs showing the results of analysis, performed using an energy dispersion type X-ray spectrometer (EDS), of the cobalt concentration distribution in a programmed e-fuse.
Figure 9B:
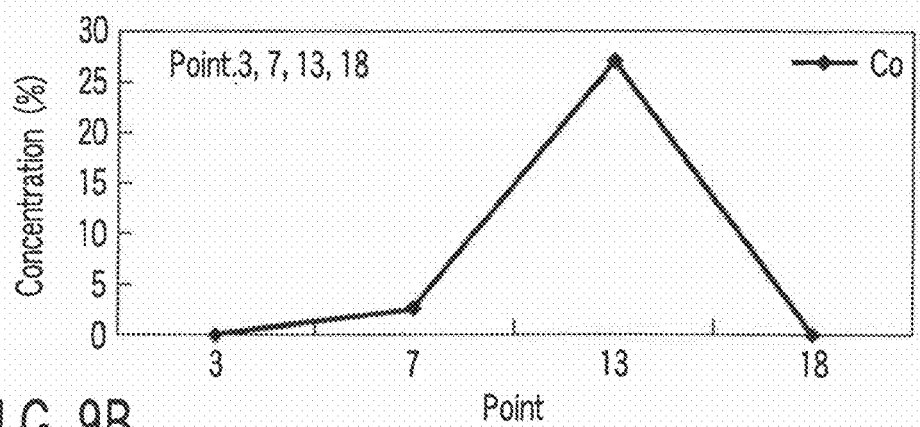

FIGS. 9A and 9B illustrate the results of analysis, performed using an energy dispersion type X-ray spectrometer (EDS), of the cobalt concentration distribution in the e-fuse 11 after programming. Point numbers plotted on the abscissa in each of FIGS. 9A and 9B correspond to point numbers shown in FIG. 8. As shown in FIGS. 9A and 9B, cobalt forming the salicide layer present on the polysilicon layer 13 before programming is localized to the cathode after programming.

Figure 10:
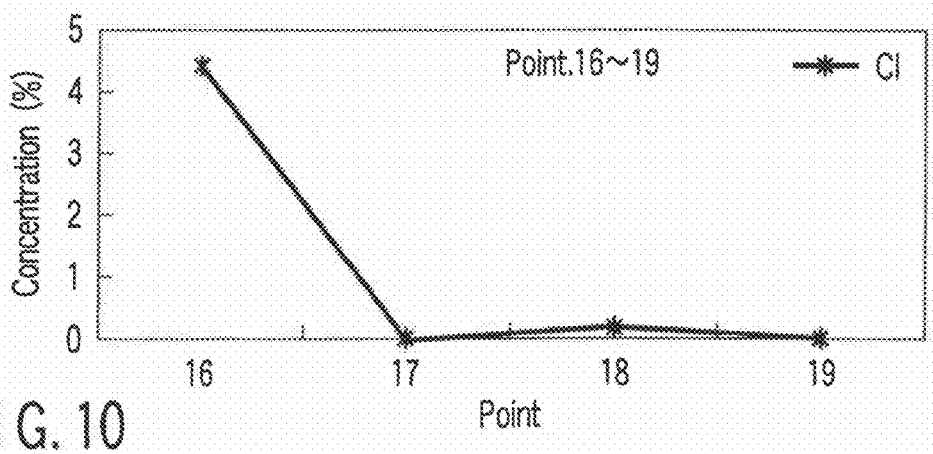
FIG. 10 is a graph showing the result of analysis, performed by an energy dispersion type X-ray spectrometer (EDS), of the chlorine ion concentration distribution in the programmed e-fuse.

FIG. 10 shows the distribution of chlorine ions (Cl) mixed in the polysilicon layer 13 during the fabrication process of the e-fuse 11. After programming, chlorine ions as negative ions are localized to the anode. In this embodiment as described above, when the polysilicon layer 13 fuses, negative ions drift to the anode and positive ions drift to the cathode by the electric field. Accordingly, this phenomenon is caused by drift by the electric field, unlike the phenomenon caused by electromigration in reference 2 described earlier.

Figure 11A:
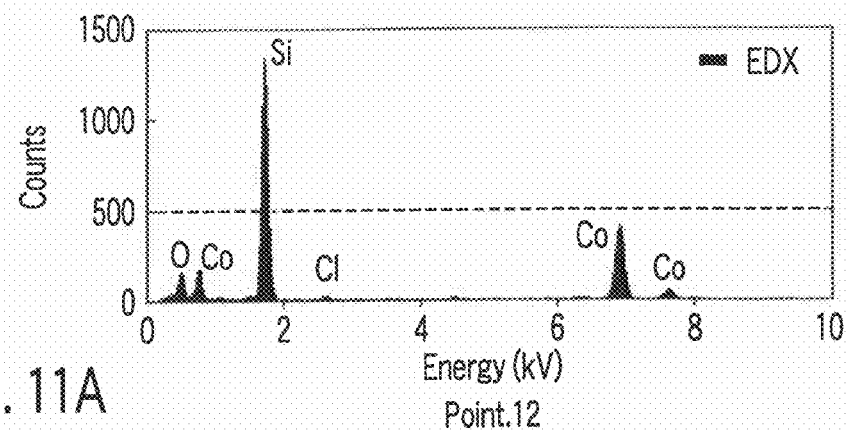
FIGS. 11A and 11B are graphs each showing the concentration of cobalt localized to the cathode.
Figure 11B:
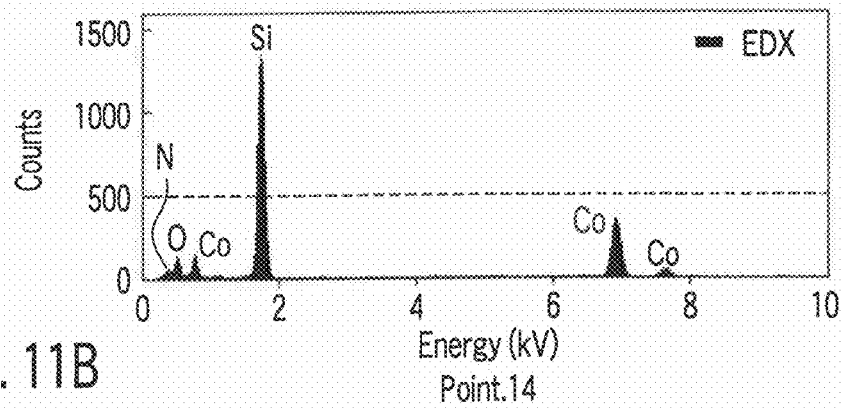

FIGS. 11A and 11B illustrate the concentrations of cobalt localized to the cathode. FIG. 11A corresponds to point number 12 shown in FIG. 8, and FIG. 11B corresponds to point number 14 shown in FIG. 8. As shown in FIGS. 11A and 11B, cobalt distributes almost evenly in the direction of depth of the fuse link FL. This indicates that the cobalt element drifts by the electric field when the polysilicon layer 13 fuses during programming.

FIG. 12A shows a TEM photograph of the e-fuse 11 after programming, and FIG. 12B shows TEM electron beam diffraction images of the e-fuse 11 after programming. In 12B, the same reference symbols as in FIGS. 6 and 12A denote the same portions. Reference symbol E denotes an electron beam diffraction image of single-crystal silicon. Many bright points are observed as a result of electron interference caused by lattice periodicity. Since a polycrystalline material has slight periodicity, electron beam diffraction images as indicated by C and D are obtained. An amorphous material has no periodicity, so only one bright but blurred point is present in each image. The polysilicon layer 13 of the e-fuse 11 before programming is polycrystalline. Referring to FIGS. 12A and 12B, however, regions indicated by the points A and B are amorphous between the localized cobalt in the fuse link FL and the anode (+). This indicates that polysilicon which has fused into a liquid is rapidly cooled into a solid.

Figure 13:
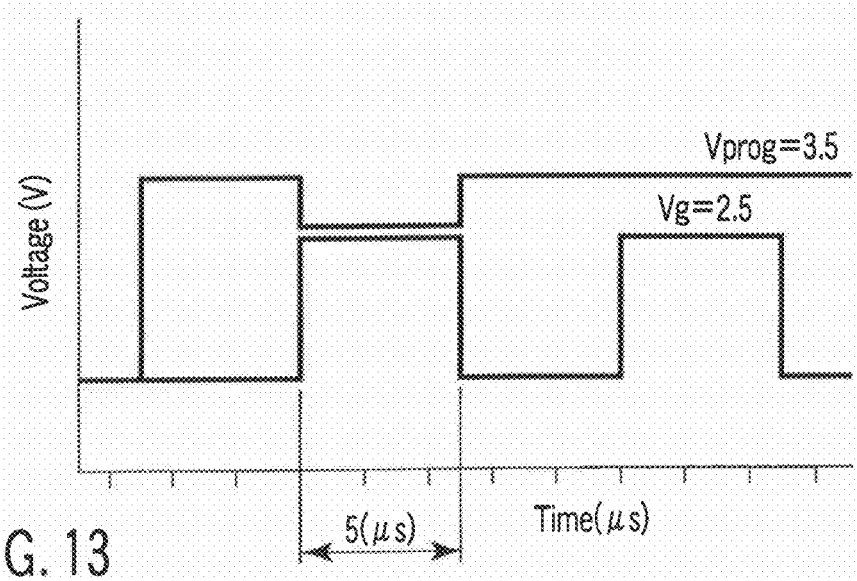
FIG. 13 is a graph showing the relationship between a gate voltage Vg of the MOS transistor shown in FIG. 3 and a programming voltage Vprog.

FIG. 13 shows the relationship between the gate voltage Vg of the MOS transistor 19 shown in FIG. 3 and the programming voltage Vprog. To program the e-fuse 11, as described previously, the programming voltage Vprog was set at 3.5 V, and pulses were supplied to the gate electrode several times under the conditions that Vg=2.5 V and period T=5 µs. As shown in FIG. 13, after the programming voltage Vprog was supplied, the MOS transistor 19 was turned on to allow an electric current to flow through the e-fuse 11. Since the pulse generator 20 used in the measurements had a low current supply capability, the programming voltage Vprog slightly dropped when an electric current flowed through the element. Therefore, when the MOS transistor 19 was turned on for the first time, the e-fuse 11 was not programmed and had a low resistance and hence allowed an electric current to flow. Since the electric current flowed, the programming voltage Vprog dropped from 3.5 V to 2.9 V. While the gate voltage Vg was supplied, the e-fuse 11 kept its low resistance. When the gate voltage Vg was set at 0 V after that, no electric current flowed through the e-fuse 11 any longer, so the programming voltage Vprog stopped dropping. Even when the MOS transistor 19 was turned on again in 5 µs, the programming voltage Vprog did not drop. This shows that the resistance of the e-fuse 11 rose to allow no electric current to flow. That is, the e-fuse 11 was programmed and its resistance value was raised after the programming voltage Vprog was applied for the first time and before the programming voltage Vprog was applied for the second time.

Current consumption required to program the e-fuse 11 was measured by connecting a resistor of, e.g., 5 ($\Omega$) in series with the e-fuse 11 in the arrangement shown in FIG. 3, and measuring an electric current flowing through this resistor. When the measurement was performed under the conditions that gate voltage Vg=2.5 V, programming voltage Vprog=3.5 V, and pulse period T=5 µs, the electric current during programming was found to be about 10 (mA).

Electric currents flowing through the e-fuse 11 before and after programming under the above conditions are as shown in FIG. 4. That is, the current value before programming is substantially 1 to 4 mA. By contrast, the current value after programming is 0.1 µA in each sample shown in FIG. 4. Since this value is the measurement limit, the actual electric current is presumably 0.1 µA or less. From this current value after programming, the resistance value of the e-fuse 11 after programming is probably about 35 M$\Omega$ or more.

In the e-fuse 11 according to the first embodiment described above, when an electric current is supplied between the first and second terminals N1 and N2 during programming, the polysilicon 13 melts, and the metal element forming the salicide layer 14 drifts by the electric field and is localized to one of the first and second terminals N1 and N2. Therefore, the e-fuse 11 exhibits a high resistance after programming. The time during which the polysilicon 13 melts and the metal element drifts by the electric field is 5 µs or less. This makes high-speed programming possible. Since the programming time of one e-fuse is short, a time required to program a plurality of e-fuses can be reduced.

An electric current flowing through one e-fuse during programming is about 10 mA, which is the same as an electric current required to program any conventional e-fuse. However, the programming time is shorter than that for any conventional e-fuse, and this can greatly reduce the current consumption required for programming.

In the above explanation, the polysilicon layer 13 is not doped with either an n- or p-type impurity. However, the same effects as when the polysilicon layer 13 is undoped can be obtained even when the polysilicon layer 13 is doped with an n-type impurity and/or p-type impurity.

Second Embodiment

FIGS. 14 to 19 illustrate the second embodiment. In FIGS. 14 to 19, the same reference numerals as in FIGS. 1 and 2 denote the same parts.

The e-fuse described above is programmed only once. However, if the fuse link FL melts again, the localized cobalt becomes movable in the fuse link FL again, and this varies the resistance value of the fuse link FL. If the resistance value of the e-fuse thus varies, data of the e-fuse changes to deteriorate the reliability.

Data is read from the e-fuse by allowing a read current to flow through the e-fuse, and detecting a change in resistance value as a change in current value. In this manner, data stored in the e-fuse can be read out. This electric current for data read is set much smaller than an electric current for programming. That is, a read voltage Vread is set at, e.g., 0.5 V with respect to programming voltage Vprog=3.5 V. However, data read is repetitively performed a number of times, while programming is performed only once. This largely extends the total time during which the read current flows. Accordingly, if the localized cobalt becomes movable, albeit slightly, owing to process variations or the use environment of fuse data read, the resistance value of the e-fuse changes to change data to be discriminated, thereby posing the problem of reliability.

In the second embodiment, therefore, an electric current flows in different current paths of an e-fuse during programming and data read of the e-fuse, thereby preventing the movement of a localized metal element and improving the reliability.

Figure 14:
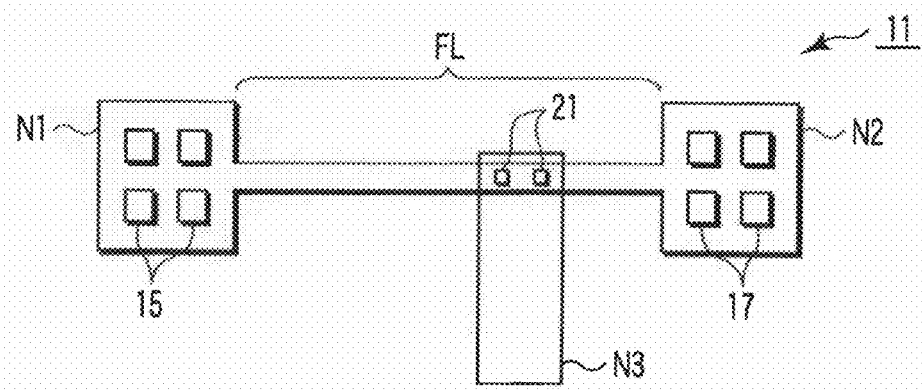
FIG. 14 is a plan view showing the second embodiment of the present invention.

That is, referring to FIG. 14, contacts 21 are connected onto a fuse link FL, and a third terminal N3 is connected via the contacts 21. The connecting position of the third terminal N3 is shifted from a central portion in the longitudinal direction of the fuse link FL toward a second terminal N2 to which cobalt as a metal element forming a salicide layer is localized after programming. The contacts 21 are made of a metal, e.g., tungsten, having a melting point higher than that of cobalt.

Figure 15:
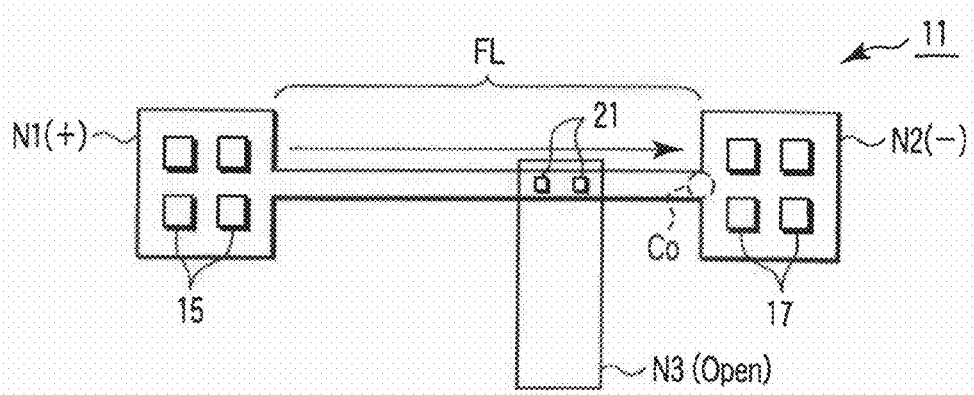
FIG. 15 is a view showing the relationship between the voltage and electric current in each portion when programming is performed in FIG. 14.

FIG. 15 shows the relationship between the voltage and electric current in each portion during programming. During programming, a first terminal N1 is an anode, the second terminal N2 is a cathode, and the third terminal N3 is open. When programming is performed in this state, an electric current flows from the first terminal N1 to the second terminal N2 as indicated by the arrow in FIG. 15, and cobalt is localized to the second terminal N2 as described above. In the fuse link FL, a salicide layer disappears upon programming from a region between the connecting portion of the contacts 21 and the first terminal N1. As a consequence, this region has a high resistance.

Figure 16:
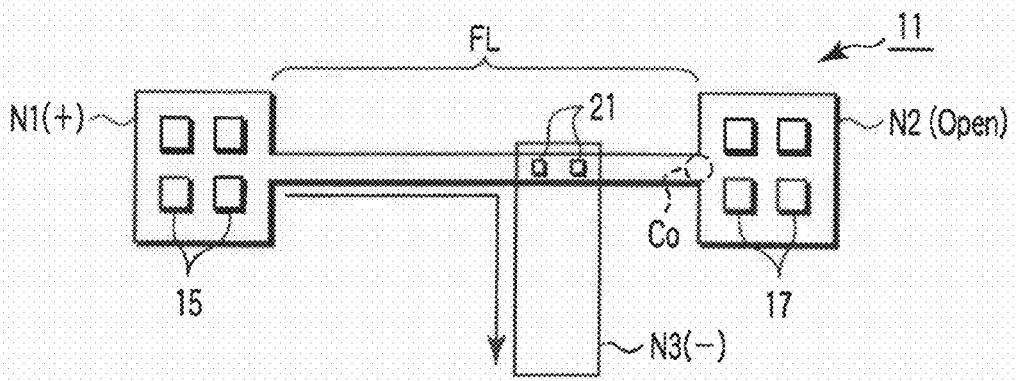
FIG. 16 is a view showing the relationship between the voltage and electric current in each portion when data read is performed in FIG. 14.

FIG. 16 shows the relationship between the voltage and electric current in each portion during data read. That is, during data read, the first terminal N1 is an anode, the third terminal N3 is a cathode, and the second terminal N2 is open. The resistance of the fuse link FL between the first terminal N1 and contacts 21 changes in accordance with the presence/absence of programming. This also changes an electric current which flows during data read. When data read is performed after the e-fuse is programmed, an electric current flows from the first terminal N1 to the third terminal N3 as indicated by the arrow in FIG. 16, and data is read out.

Since the second terminal N2 is open, no electric current flows between the contacts 21 and second terminal N2, and no electric field is applied between them. Accordingly, cobalt localized to the second terminal N2 can be prevented from moving by heat generated by an electric current or by an electric field;

FIGS. 17 to 19 illustrate a modification of the second embodiment. In FIGS. 14 to 16, a third terminal N3 is formed above a fuse link FL via contacts 21. Referring to FIG. 17, however, the third terminal N3 is formed in the same plane as the fuse link FL. That is, the third terminal N3 is connected via a branched portion 31 which is branched from the fuse link FL. Similar to FIG. 14, the formation position of the branched portion 31 is shifted from a central portion in the longitudinal direction of the fuse link FL toward a second terminal N2 to which cobalt as a metal element is localized. Also, like a first terminal N1, the second terminal N2, and the fuse link FL, the third terminal N3 and branched portion 31 are made up of a polysilicon layer and a salicide layer formed on it. Therefore, the third terminal N3 and branched portion 31 can be formed by the same process as for the first and second terminals N1 and N2 and fuse link FL. A plurality of contacts 32 are formed on the third terminal N3.

FIG. 18 shows the relationship between the voltage and electric current in each portion during programming. During programming, the first terminal N1 is an anode, the second terminal N2 is a cathode, and the third terminal N3 is open. When programming is performed in this state, an electric current flows from the first terminal N1 to the second terminal N2 as indicated by the arrow in FIG. 18, and cobalt is localized to the second terminal N2 as described above. In the fuse link FL, a salicide layer disappears upon programming from a region between the connecting portion of the branched portion 31 and the first terminal N1. As a consequence, this region has a high resistance.

FIG. 19 shows the relationship between the voltage and electric current in each portion during data read. That is, during data read, the first terminal N1 is an anode, the third terminal N3 is a cathode, and the second terminal N2 is open. When data read is performed in this state, an electric current flows from the first terminal N1 to the third terminal N3 as indicated by the arrow in FIG. 19, and data is read out. Also, no electric current flows through the localized metal element, and no electric field is applied to it. Therefore, the movement of the localized metal element can be prevented.

In the second embodiment described above, the e-fuse 11 has different current paths for programming and data read. This makes it possible to prevent an electric current from flowing through the localized metal element, and prevent an electric field from being applied to the localized metal element during data read. Therefore, the metal element localized to the second terminal N2 upon programming can be prevented from moving again in the fuse link FL to change the resistance value during data read. As a consequence, the reliability of the e-fuse can be improved.

In the second embodiment, the formation position of the third terminal N3 is shifted from the central portion of the fuse link toward the second terminal N2. However, the formation position of the third terminal N3 need only be determined on the basis of the electric charge of a metal element forming a salicide layer and the polarity of a voltage to be applied to the first and second terminals. That is, the third terminal need only be formed on the side to which the metal element is to be localized.

Third Embodiment

FIGS. 20 to 24 illustrate the third embodiment. The e-fuse 11 explained in the first embodiment must have a large resistance ratio before and after programming, and it is essential to form a region from which the salicide layer disappears after programming. However, the moment the supply of a voltage is shut off after programming the Coulomb force which has localized a metal element disappears, so the metal element starts diffusing. If the temperature of the fuse link FL lowers slowly and the diffusion time of the metal element is shorter than the setting time of the fuse link FL, the metal element diffuses in the fuse link FL, and no high resistance ratio can be obtained any longer before and after programming. This may deteriorate the reliability of the e-fuse.

In the third embodiment, therefore, after the supply of a voltage to an e-fuse is shut off, the temperature of a fuse link is lowered and the fuse link is set before a localized metal element diffuses.

Figure 20:
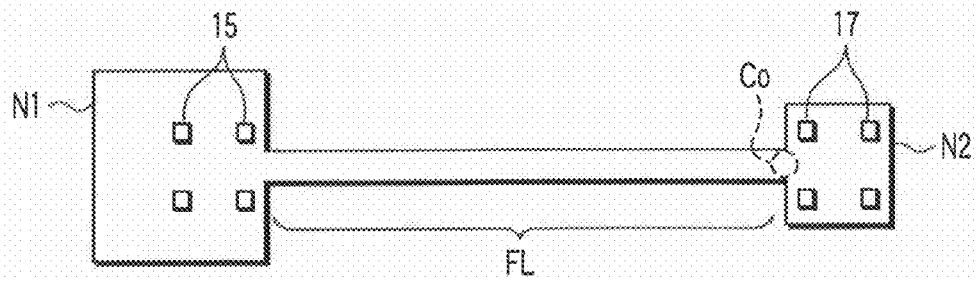
FIG. 20 is a plan view showing the third embodiment of the present invention.

FIG. 20 shows an example in which the area of a first terminal N1 opposite to a second terminal N2 to which a metal element is localized during programming is increased. That is, the area of the first terminal N1 is larger than the area of a fuse link FL. In this arrangement, when a voltage is applied between the first and second terminals N1 and N2 during programming as in the first embodiment, a polysilicon layer in the fuse link FL fuses. In this embodiment, the metal element is a cation. Therefore, this metal ion is drawn to the negatively charged second terminal N2 by the Coulomb force and localized to the second terminal N2.

When the voltage between the first and second terminals N1 and N2 is shut off after that, the temperature of the fuse link FL lowers. The first terminal N1 having the area larger than that of the fuse link FL is in contact with, e.g., a surrounding insulating film in a large area. This makes the heat radiation rate of the first terminal N1 higher than that of the fuse link FL. After the programming voltage is shut off, therefore, the temperature of the fuse link FL near the first terminal N1 lowers faster than the temperature of the fuse link FL near the second terminal N2. This makes it possible to prevent the localized metal element from diffusing in the fuse link FL again, and thereby hold a high resistance value of the fuse link FL.

Figure 21:
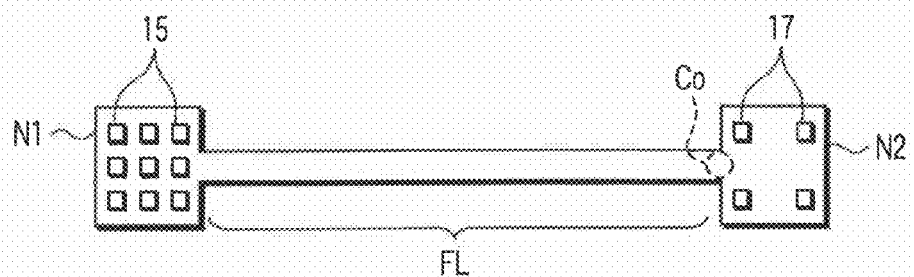
FIG. 21 is a plan view showing the first modification of the third embodiment.

FIG. 21 shows the first modification of the third embodiment. Referring to FIG. 21, the areas of first and second terminals N1 and N2 are equal. However, the number of contacts 15 connected to the first terminal N1 is larger than the number of contacts 17 connected to the second terminal N2. That is, the number of contacts connected to a terminal opposite to a terminal to which a metal element is localized after programming is larger than the number of contacts connected to the terminal to which the metal element is localized. As shown in FIG. 2, the contacts 15 are connected to a line 16. This makes the thermal conductivity of the first terminal N1 higher than that of the second terminal N2.

After the programming voltage is shut off in the above arrangement, the heat of a fuse link FL is radiated to a surrounding insulating film and is also released through the contacts 15 having a high thermal conductivity. Therefore, the temperature of the fuse link FL near the first terminal N1 lowers faster than the temperature of the fuse link FL near the second terminal N2. This makes it possible to prevent the localized metal element from diffusing in the fuse link FL again, and thereby hold a high resistance value of the fuse link FL.

Figure 22:
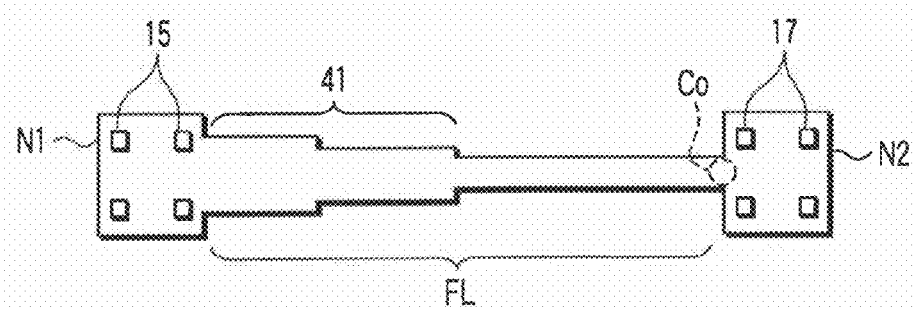
FIG. 22 is a plan view showing the second modification of the third embodiment.

FIG. 22 shows the second modification of the third embodiment. Referring to FIG. 22, the width of a region 41 of a fuse link FL near a first terminal N1 is larger than the width of a region of the fuse link FL near a second terminal N2. That is, the width of the fuse link is gradually increased from the second terminal N2 to which a metal element is localized after programming toward the first terminal N1 opposite to the second terminal N2. The wide region 41 of the fuse link FL is in contact with a surrounding insulating film in a large area. This increases the heat radiation rate.

After the programming voltage is shut off in the above arrangement, the heat radiation rate in the region 41 of the fuse link FL is higher than that of the other region of the fuse link FL. Therefore, the temperature of the first terminal N1 lowers faster than that of the second terminal N2. This makes it possible to prevent the localized metal element from diffusing in the fuse link FL again, and thereby hold a high resistance value of the fuse link FL.

Figure 23:
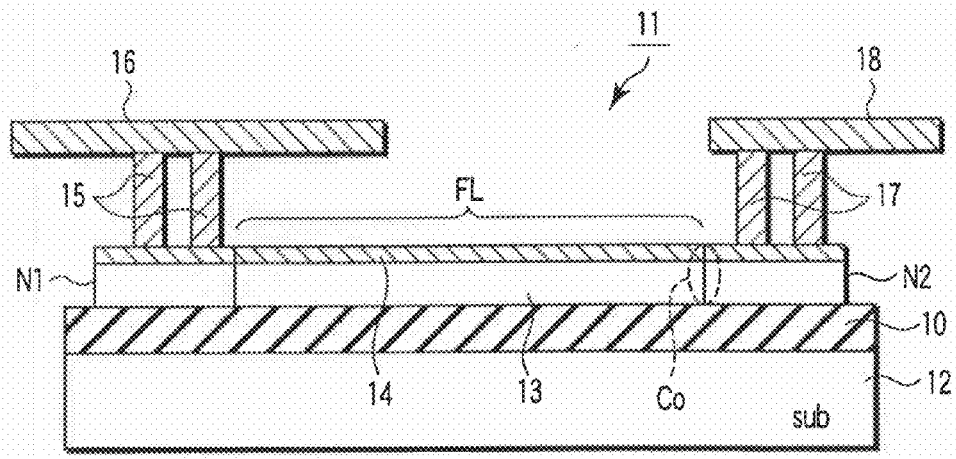
FIG. 23 is a plan view showing the third modification of the third embodiment.

FIG. 23 shows the third modification of the third embodiment. In this modification, the areas of lines connected to first and second terminals N1 and N2 are different. That is, referring to FIG. 23, the area of a line 16 connected to contacts 15 connected to the first terminal N1 is larger than that of a line 18 connected to contacts 17 connected to the second terminal N2. That is, the area of the line connected to the terminal opposite to the terminal to which a metal element is localized after programming is increased. Therefore, the line 16 extends over a fuse link FL. The lines 16 and 18 are made of a material, e.g., copper, having a high thermal conductivity.

After the programming voltage is shut off in this arrangement, the heat of the fuse link FL is radiated to the lines 16 and 18 via the contacts 15 and 17. This heat is also radiated to the lines 16 and 18 via an insulating film (not shown). Since the area in which the line 16 overlaps the fuse link FL is larger than the area in which the line 18 overlaps the fuse link FL, the heat radiation rate of the first terminal N1 is higher than that of the second terminal N2. Accordingly, it is possible to rapidly radiate heat from a region from which a metal element forming a salicide layer has disappeared, and hold a high resistance value of the fuse link FL.

Figure 24:
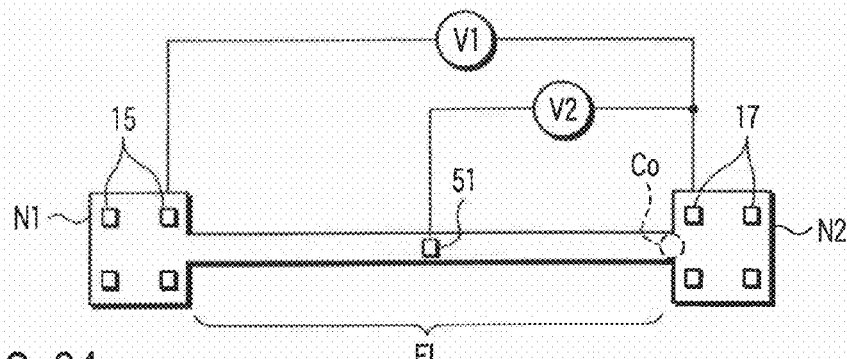
FIG. 24 is a plan view showing the fourth modification of the third embodiment.

FIG. 24 shows the fourth modification of the third embodiment. Referring to FIG. 24, a contact 51 as a third terminal is connected to a central portion of a fuse link FL. During programming, voltages supplied to first and second terminals N1 and N2 and the contact 51 are changed to control the cooling rate of the fuse link FL in each portion.

That is, when programming is performed in the above arrangement, a programming voltage V1 is supplied between the first and second terminals N1 and N2 to localize a metal element to the vicinity of the second terminal N2. After that, the voltage V1 is shut off while a voltage V2 is applied between the second terminal N2 and contact 51. Since no voltage is applied between the first terminal N1 and contact 51, no electric current flows between them. Therefore, the generation of Joule heat stops between the first terminal N1 and contact 51, and the temperature starts dropping by natural heat radiation. In this state, the application of the voltage V2 is stopped at the timing at which the temperature of the fuse link FL becomes lower than the melting point of polysilicon and the fuse link FL sets. Since the region between the first terminal N1 and contact 51 from which a metal element forming a salicide layer has disappeared has already set, the metal element does not diffuse in this region again. Accordingly, a high resistance value of the fuse link FL can be held.

In the third embodiment described above, after the metal element is localized to the second terminal N2 by programming, the temperature of the fuse link FL near the first terminal N1 opposite to the second terminal N2 is rapidly lowered. This makes it possible to prevent the localized metal element from diffusing in the fuse link FL again, and maintain the reliability of the e-fuse.

Figure 25:
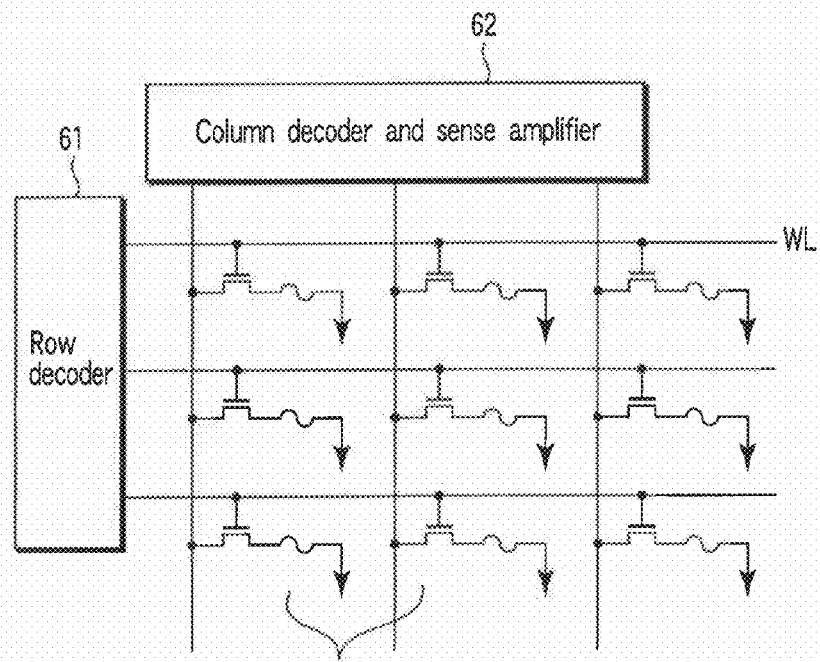
FIG. 25 is a circuit diagram showing an example in which the e-fuse having the arrangement of the first or second embodiment is applied to a redundancy circuit of a semiconductor memory.

FIG. 25 shows a circuit in which the e-fuse having the arrangement explained in the first or second embodiment is applied to, e.g., a semiconductor memory. Each memory MC is made up of the e-fuse and a MOS transistor. The memory cells MC are arranged in a matrix manner. The gate of each MOS transistor is connected to a corresponding word line WL, and one end of a current path of each MOS transistor is connected to a corresponding bit line BL. The word lines WL are connected to a row decoder 61, and the bit lines BL are connected to a column decoder 62. A word line and bit line selected by the row decoder 61 and column decoder 62 are driven to program a corresponding memory cell MC.

The e-fuse of each embodiment has a short programming time. Therefore, even when a large number of memory cells are programmed, the whole programming time can be reduced. In addition, since an electric current required to program one e-fuse is small, the total current consumption can be reduced even when a large number of program cells are programmed.

In the e-fuse 11 of each of the first to third embodiments described above, the salicide layer is formed on the polysilicon layer. However, the present invention is not limited to this arrangement, and the same effects as in the first to third embodiments can be obtained by forming a metal layer on the polysilicon layer.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

The invention claimed is:

1. A method of programming a semiconductor device, in which
supplying an electric current to a fuse link via first and second terminals, said fuse link formed between the first and second terminals, the first and second terminals and fuse link having a polysilicon layer and a layer formed on the polysilicon layer and containing a metal element; and
fusing the polysilicon layer in at least a portion of the fuse link by means of heat generated by the electric current, and localizing the metal element to a portion of the fused polysilicon layer, which is near the first terminal,
wherein the metal element is localized by drifting by an electric field during fusing of the polysilicon layer.

2. The method according to claim 1, wherein before being turned on, the fuse link is made of the same material as a gate electrode of a MOS transistor.

3. The method according to claim 1, wherein the metal element is an element selected from the group consisting of cobalt, titanium, nickel, and tungsten.

4. The method according to claim 1, wherein the layer containing the metal element is a silicide layer.

5. The method according to claim 1, wherein the layer containing the metal element is a metal layer.

6. The method according to claim 1, wherein when the metal element is a cation, a potential of the first terminal is lower than that of the second terminal during programming.

7. The method according to claim 1, wherein a setting rate of the fuse link is higher than a diffusion rate of the localized metal element.

* * * * *